(12) United States Patent
Munnelly et al.

(10) Patent No.: US 6,936,384 B2
(45) Date of Patent: Aug. 30, 2005

(54) INFRARED-SENSITIVE COMPOSITION CONTAINING A METALLOCENE DERIVATIVE

(75) Inventors: Heidi M. Munnelly, Windsor, CO (US); Jianbing Huang, Trumball, CT (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 191 days.

(21) Appl. No.: 10/210,508

(22) Filed: Aug. 1, 2002

(65) Prior Publication Data

US 2004/0023136 A1 Feb. 5, 2004

(51) Int. Cl.[7] .......................... G03F 7/029; G03F 7/032; G03F 7/30; C08F 2/46
(52) U.S. Cl. ................... 430/17; 430/273.1; 430/286.1; 430/302; 430/944; 430/916; 430/926; 430/281.1; 522/25; 522/29
(58) Field of Search ................................ 430/17, 273.1, 430/281.1, 286.1, 302, 944, 916, 926; 522/25, 29

(56) References Cited

U.S. PATENT DOCUMENTS

| | | | |
|---|---|---|---|
| 4,548,891 A | 10/1985 | Riediker et al. | |
| 4,590,287 A | 5/1986 | Riediker et al. | |
| 4,713,401 A | 12/1987 | Riediker et al. | |
| 4,855,468 A | 8/1989 | Riediker et al. | |
| 4,857,654 A | 8/1989 | Riediker et al. | |
| 4,910,121 A | 3/1990 | Riediker et al. | |
| 4,962,012 A | 10/1990 | Riediker et al. | |
| 4,970,136 A | 11/1990 | Riediker et al. | |
| 5,008,302 A | 4/1991 | Husler et al. | |
| 5,011,755 A | 4/1991 | Rohde et al. | |
| 5,026,625 A | 6/1991 | Riediker et al. | |
| 5,034,307 A | 7/1991 | Riediker et al. | |
| 5,049,479 A | 9/1991 | Zertani et al. | |
| 5,068,371 A | 11/1991 | Steiner et al. | |
| 5,086,086 A | 2/1992 | Brown-Wensley et al. | |
| 5,106,722 A | 4/1992 | Husler et al. | |
| 5,192,642 A | 3/1993 | Steiner et al. | |
| 5,219,709 A | 6/1993 | Nagasaka et al. | |
| 5,229,253 A | 7/1993 | Zertani et al. | |
| 5,306,600 A | 4/1994 | Steiner et al. | |
| 5,389,700 A | 2/1995 | Sasaki | |
| 5,491,046 A | 2/1996 | DeBoer et al. | |
| 5,496,903 A | 3/1996 | Watanabe et al. | |
| 5,545,676 A | 8/1996 | Palazzotto et al. | |
| 5,885,746 A | 3/1999 | Iwai et al. | |
| 5,965,319 A | 10/1999 | Kobayashi | |
| 6,007,965 A | 12/1999 | Yamaoka et al. | |
| 6,010,824 A | 1/2000 | Komano et al. | |
| 6,051,366 A | 4/2000 | Baumann et al. | |
| 6,093,518 A | 7/2000 | Imai et al. | |
| 6,153,356 A | 11/2000 | Urano et al. | |
| 6,153,660 A | 11/2000 | Fujimaki et al. | |
| 6,171,759 B1 * | 1/2001 | Inaishi et al. | ........... 430/926 |
| 6,187,511 B1 | 2/2001 | Reath Bennett et al. | |
| 6,232,038 B1 | 5/2001 | Takasaki et al. | |
| 6,245,481 B1 | 6/2001 | Teng | |
| 6,264,920 B1 | 7/2001 | Achilefu et al. | |
| 6,274,529 B1 | 8/2001 | Fusco et al. | |

(Continued)

FOREIGN PATENT DOCUMENTS

| | | |
|---|---|---|
| EP | 0 573 805 A1 | 5/1993 |
| EP | 1 106 381 A | 6/2001 |
| WO | WO 00/48836 | 8/2000 |

OTHER PUBLICATIONS

Masaru Kimura et al., "Development of New Three Component Photo–Polymerization Systems Efficient Even Near the Infrared Region", The Chemical Society of Japan (Bull. Chem. Soc. Jpn.), (May 2002), pp. 1159–1162.

Li Bin et al., "Synthesis and Absorption Characteristics of Two Infrared Cyanine Dyes", Tsinghua Science and Technology, ISSN 1007–0214 13/24, vol. 5, No. 2,, Jun. 2000, pp. 176–179.

Qun Li et al., "Synthesis and Characterization of Heptamethine Cyanine Dyes", Molecules, Jun. 1997, pp. 91–98.

James J. Flanagan Jr. et al., "Functionalized Tricarbocyanine Dyes as Near–Infrared Fluorescent Fluorescent Probes for Biomolecules", Bioconjugate Chem, Jun. 1997, pp. 751–756.

Sartomer Company Inc., "A Study of Initiating Systems for Photpolymerization of a Water Dispersible Radiation Curable Elastomer", Sartomer Bulletin, Jun. 2002, 10 pages.

Annex to Form PCT/ISA/206, Communication Relating to the Results of the Partial International Search, for PCT/US03/24140 (2 pages).

*Primary Examiner*—Richard L. Schilling
(74) *Attorney, Agent, or Firm*—Faegre & Benson LLP

(57) ABSTRACT

The present invention provides an initiator system including an infrared-absorbing compound that exhibits an electronic transition band in the near-infrared region, an initiator, and a metallocene compound. Upon exposure to infrared radiation, the initiator system is capable of producing radicals sufficient to initiate a photopolymerization reaction. Suitable infrared-absorbing compounds include indocyanine dyes, for example. Trihalomethyl triazine compounds and onium compounds are suitable initiators. Suitable metallocene compounds include ferrocenes and titanocenes. The present invention also provides an infrared-sensitive composition including an ethylenically unsaturated polymerizable component, an infrared-absorbing compound that exhibits an electronic transition band in the near-infrared region, an initiator, and a metallocene compound. The infrared-sensitive composition provides improved photospeed and sensitivity in some embodiments. A printing plate precursor including an infrared-sensitive coating is also provided. The printing plate precursor exhibits enhanced shelf life in some embodiments. A method of making a printing plate precursor and a method for making a printable lithographic printing plate are further provided by the invention.

37 Claims, No Drawings

U.S. PATENT DOCUMENTS

| | | |
|---|---|---|
| 6,284,433 B1 | 9/2001 | Ichikawa et al. |
| 6,309,792 B1 | 10/2001 | Hauck et al. |
| 6,329,122 B2 | 12/2001 | Hotta et al. |
| 6,331,376 B1 | 12/2001 | Kojima et al. |
| 6,335,144 B1 | 1/2002 | Murota et al. |
| 6,399,271 B1 | 6/2002 | Ray et al. |
| 6,503,959 B1 | 1/2003 | Nishiyama et al. |
| 6,664,025 B2 * | 12/2003 | Baumann et al. ........... 430/916 |
| 6,692,896 B2 * | 2/2004 | Shimada et al. ......... 430/281.1 |
| 2001/0018164 A1 | 8/2001 | Furukawa |
| 2003/0077541 A1 | 4/2003 | Shibuya et al. |

* cited by examiner

INFRARED-SENSITIVE COMPOSITION CONTAINING A METALLOCENE DERIVATIVE

TECHNICAL FIELD

The present invention relates to infrared-sensitive photopolymerizable compositions, printing plate precursors and printable lithographic printing plates containing the infrared-sensitive compositions.

The art of lithographic printing using fountain solutions is based on the immiscibility of oil and water. Lithographic printing plates include ink-receptive hydrophobic areas formed on a hydrophilic surface. When an imageable surface of the printing plate is moistened with water and ink is applied, the hydrophilic surface retains the water and rejects the ink, and the ink-receptive areas accept the ink and repel the water. The ink may then be transferred from the ink-wetted areas to a surface of a material upon which the image is to be reproduced. Typically, the ink is first transferred to an intermediate blanket, which in turn transfers the ink to the surface of the material upon which the image is to be reproduced.

Lithographic printing plates are formed from printing plate precursors, which typically include a radiation-sensitive coating applied over a hydrophilic surface of a substrate. After a portion of the radiation-sensitive coating is exposed to radiation (a process commonly referred to as "imagewise exposure"), the exposed portion becomes either more soluble or insoluble in a developer than an unexposed portion of the coating.

During developing, either the exposed portion or the unexposed portion of the coating is washed away by the developer. The remaining coating provides an ink-receptive image, while the regions of the printing plate precursor where the coating has been removed during developing will repel ink.

Radiation-sensitive (or "photosensitive") compositions usable particularly for high-performance printing plate precursors must meet high requirements. The focus of research aimed at improving the properties of radiation-sensitive compositions and of the corresponding printing plate precursors is in essentially two areas. The first area deals with the improvement of the properties of the initiator systems in the radiation-sensitive compositions. The second area deals with the search for novel polymeric compounds ("binders") which contribute to the physical properties of the radiation-sensitive layers.

The first area is of particular importance if the sensitivity of printing plate precursors is to be customized or tuned to certain ranges of electromagnetic radiation. Also, the shelf-life and radiation-sensitivity of the materials are strongly influenced by the nature of the initiator systems in the radiation-sensitive compositions. Therefore, improvements in shelf-life and sensitivity may be achieved by optimization of the initiator system.

The latest developments in the field of printing plate precursors deal with photosensitive compositions that can be imagewise exposed by means of lasers or laser diodes. This type of exposure does not require films as intermediate information carriers since lasers can be controlled by computers. High-performance lasers or laser diodes which are used in commercially available image setters emit light in wavelength ranges of between 800 to 850 nm and between 1060 and 1120 nm, respectively.

Therefore, printing plate precursors, or photosensitive compositions contained therein, which are to be imagewise exposed by means of such image-setters must be sensitive to radiation in the near-infrared region of the electromagnetic spectrum. It is also desirable to optimize the sensitivity of the photosensitive composition, so that low-intensity lasers or laser diodes may be used. Low-intensity lasers are less expensive and more reliable than high-intensity lasers.

Plates which can be imagewise exposed with infrared lasers are reported by, for example, U.S. Pat. No. 5,491,046 to DeBoer, et al. These plates are negative-working and, after imagewise exposure, a preheating step within a very narrow temperature range is required.

An infrared-sensitive composition is reported in U.S. Pat. No. 6,309,792 to Hauck, et al. The infrared-sensitive composition includes a compound capable of absorbing infrared light, a compound capable of producing radicals, and a polycarboxylic acid including a heterocyclic aromatic moiety.

A near-infrared-polymerizable composition is reported by U.S. Pat. No. 5,496,903 to Watanabe, et al. The composition includes an ethylenically unsaturated compound, a cyanine dye, an s-triazine compound, and an organoboron salt.

The use of metallocenes in photopolymerizable compositions is well-known. A photopolymerizable mixture including a polymeric binder, a free-radically polymerizable compound, a photoreducible dye, a trihalomethyl compound and a metallocene is reported in U.S. Pat. Nos. 5,049,479 and 5,229,253 to Zertani, et al The mixture is reported to be imageable by radiation in the visible and ultraviolet regions.

A photopolymerizable composition and photopolymerizable printing plate is reported in U.S. Pat. No. 6,153,356 to Urano, et al. The photopolymerizable composition includes an ethylenically unsaturated compound, a selected cyanine dye, and a photopolymerization initiator. The photopolymerization initiator may be a halogenated hydrocarbon derivative such as a halomethyl triazine, a titanocene compound, a hexaarylbiimidazole compound, a borate, a diaryliodonium salt or an inorganic peroxide. The composition is reported to be imageable by radiation in the range from 700 to 1300 nm.

U.S. Pat. No. 5,885,746 to Iwai, et al. also reports a composition including an initiator such as a triazine compound, a titanocene compound, or an acridine compound, and which is imageable by visible radiation.

U.S. Pat. No. 6,010,824 to Komano, et al reports a photosensitive resin composition including a polymeric binder, an ethylenically unsaturated monomer, an acridine compound, and a halogenated triazine as a photopolymerization initiator. The photosensitive resin composition may optionally include a titanocene compound as an additional photopolymerization initiator. The photosensitive resin composition is reported to be imageable by visible radiation.

Radiation-sensitive compositions which show both a high degree of radiation sensitivity and a sufficiently long shelf-life when used in the manufacture of printing plate precursors are presently only known in connection with ultraviolet- or visible-imageable compositions. However, printing plate precursors using such compositions cannot be imagewise exposed by means of the above-mentioned lasers or laser diodes.

SUMMARY OF THE INVENTION

In one embodiment, the present invention provides an initiator system including an infrared-absorbing compound that exhibits an electronic transition band in the near-infrared region, an initiator, and a metallocene compound.

Upon exposure to infrared radiation, the initiator system is capable of producing radicals sufficient to initiate a photopolymerization reaction.

The present invention also provides an infrared-sensitive composition including an ethylenically unsaturated polymerizable component, an infrared-absorbing compound that exhibits an electronic transition band in the near-infrared region, an initiator, and a metallocene compound. Upon exposure to infrared radiation, the composition is capable of producing radicals sufficient to initiate a photopolymerization reaction. The infrared-sensitive composition is suitable as a photosensitive material in a printing plate precursor, for example.

Also provided by the present invention is a method of making a printing plate precursor, including the steps of: a) preparing a substrate to receive a coating; b) applying to a portion of the substrate a solvent-based composition including an ethylenically unsaturated polymerizable component, an infrared-absorbing compound that exhibits an electronic transition band in the near-infrared region, an initiator, a metallocene compound, and a polymeric binder; and c) removing the solvent to leave a coating on the substrate, to yield the precursor. Upon exposure to infrared radiation, the coating on the substrate is capable of producing radicals sufficient to initiate a photopolymerization reaction.

The present invention further provides a printing plate precursor having a coating including an ethylenically unsaturated polymerizable component, an infrared-absorbing compound that exhibits an electronic transition band in the near-infrared region, an initiator, a metallocene compound, and a polymeric binder. Upon exposure to infrared radiation, the coating is capable of producing radicals sufficient to initiate a photopolymerization reaction.

Another embodiment of the present invention provides a method for making a printable lithographic printing plate, including the steps of: a) coating a substrate with an infrared-sensitive composition to provide a printing plate precursor; b) imagewise exposing the printing plate precursor to infrared radiation to initiate a polymerization reaction; and c) developing the exposed printing plate precursor with a developer to obtain a printable lithographic printing plate. The infrared-sensitive composition of the coating includes an ethylenically unsaturated polymerizable component, an infrared-absorbing compound that exhibits an electronic transition band in the near-infrared region, an initiator, a metallocene compound, and a polymeric binder. Upon exposure to infrared radiation, the infrared-sensitive composition is capable of producing radicals sufficient to initiate a photopolymerization reaction. The invention also provides a printing plate obtained by the method.

DETAILED DESCRIPTION OF THE INVENTION

Initiator System

A photopolymerization initiator system generally produces active radicals upon the absorption of electromagnetic radiation of an appropriate wavelength. The active radicals may then initiate a polymerization reaction, which is generally an addition polymerization of an ethylinically unsaturated polymerizable component. An initiator system often includes a sensitizing dye and an initiator component that is capable of producing active radicals, and may include coinitiators.

In one embodiment, the present invention provides an initiator system including an infrared-absorbing compound that exhibits an electronic transition band in the near-infrared region, an initiator, and a metallocene compound. Upon exposure to infrared radiation, the initiator system is capable of producing radicals sufficient to initiate a photopolymerization reaction.

In the initiator system of the present invention, the infrared-absorbing compound is present from about 0.2 to about 87 wt.-%, preferably from about 5 to about 60 wt.-%; the initiator is present from about 6 to about 93 wt.-%, preferably from about 27 to about 78 wt.-%; and the metallocene is present from about 3 to about 83 wt.-%, preferably from about 9 to about 40 wt.-%; where each percentage is determined relative only to the total weight of the components of the initiator system.

The initiator system of the present invention may be employed to initiate a photopolymerization reaction, especially where the polymerization reaction includes a component that is free-radical polymerizable. Upon exposure to infrared radiation of an appropriate wavelength, the initiator system is capable of producing radicals sufficient to initiate the photopolymerization reaction.

In particular, the infrared radiation should include a wavelength that falls within a near-infrared electronic transition absorbance band of the infrared-absorbing compound in order to initiate the photopolymerization. Optimally, the source of radiation will emit infrared radiation at a wavelength that is as near to the peak of the absorbance band as possible. In other words, it is desirable to match the infrared radiation source to the absorbance band of the infrared-absorbing compound, if feasible.

In the practice of the present invention, an infrared laser is particularly suitable as an infrared light source. An infrared laser produces radiation having a known wavelength and permits control over the amount of power per unit area that impinges upon a target. Infrared lasers may also be tuned to cover a broad range of wavelengths in the infrared region. Non-lasing sources are also suitable for the practice of the present invention, provided that the necessary power is supplied to the target by radiation of the appropriate wavelength.

As is demonstrated by the following Comparative Examples 2 and 3, a combination of only the infrared-absorbing compound and initiator (i.e., without metallocene), or of the infrared-absorbing compound and metallocene (i.e., without initiator), is not capable of producing sufficient radicals to initiate the photopolymerization reaction upon exposure to infrared radiation. Therefore it is essential that all three components be present in order to produce radicals sufficient to initiate the photopolymerization reaction upon exposure to infrared radiation.

Infrared-Absorbing Compound

In the initiator system of the present invention, the sensitizing dye is an infrared-absorbing compound. Specifically, the infrared-absorbing compound is one that has an absorbance band in the near-infrared region of the electromagnetic spectrum. For the purposes of this specification, the near-infrared region of the electromagnetic spectrum includes radiation having a wavelength in the range 700–3000 nm. Particularly suitable infrared-absorbing compounds are those that have an absorbance band in the range 700–1300 nm.

The infrared-absorbing compounds that are useful in the initiator system possess a chromophore which exhibits an electronic transition in the near-infrared region. Typically the electronic transition is of the $\pi \rightarrow \pi^*$ type or $n \rightarrow \pi^*$ type. To provide adequate sensitivity to the initiator system, it is desirable that the infrared-absorbing compound have a molar extinction coefficient ($\epsilon$) of greater than about $10^4$ L/mol/cm for at least one wavelength in the near-infrared region, when measured in a thin layer or dissolved in water or an organic solvent. Preferably the infrared-absorbing compound has a molar extinction coefficient in the range $2\times10^{4}-3\times10^{5}$ L/mol/cm or greater.

Any infrared-absorbing compound that meets the criteria above is suitable for use in the initiator system. By way of example, the infrared-absorbing compound may be an azo dye, pyrazoline azo dye, oxazine dye, naphthoquinone dye, anthraquinone dye, quinoneimine dye, methine dye, arylmethine dye, squarine dye, triarylamine dye, thiazole dye, indole dye, indolizine dye, oxazole dye, cyanine dye, indocyanine dye, indotricarbocyanine dye, oxatricarbocyanine dye, thiocyanine dye, thiatricarbocyanine dye, merocyanine dye, cryptocyanine dye, naphthalocyanine dye, croconine dye, polyaniline dye, polypyrrole dye, polythiophene dye, porphyrin dye, phthalocyanine dye, pyrilium salt, or metal dithiolene; a substituted form of any of the preceding, or an ionic form of any of the preceding.

Other suitable infrared-absorbing compounds may be known, for example, in the field of tunable infrared dye lasers. A variety of infrared-absorbing compounds are available commercially from American Dye Source, Inc. (Baie D'Urfe, Quebec, Canada), H. W. Sands Corp. (Jupiter, Fla.), Epolin, Inc. (Newark, N.J.) and Hitachi High-Technologies Co. Ltd. (London, England; formerly Nissei Sangyo America).

The class of dyes known as cyanine dyes are suitable as the infrared-absorbing compound in the initiator system of the present invention. Cyanine dyes contain a chromophore having two heterocyclic groups connected by a conjugated polymethine (i.e., [—C=C—]$_n$) linkage. Near-infrared-absorbing cyanine dyes are disclosed, for example, in U.S. Pat. No. 6,309,792 to Hauck, et al, U.S. Pat. No. 6,264,920 to Achilefu, et al, U.S. Pat. No. 6,153,356 to Urano, et al, and U.S. Pat. No. 5,496,903 to Watanabe, et al.

Indocyanine dyes are particularly suitable as the infrared-absorbing compound. Indocyanine dyes contain a chromophore having two indole rings connected by a conjugated polymethine linkage.

Specific infrared-absorbing compounds known to have an electronic transition band in the near-infrared region include heptamethine cyanine dyes disclosed in Li, et al., *Molecules* 2, 91 (1997), Flanagan, et al, *Bioconjugate Chem* 8, 751 (1997), and Li, et al, *Tsinghua Sci and Tech* 5, 176 (2000); Cy7 CyDYE available from Amersham Biosciences (Piscataway, N.J.); 2-[2-[2-thiophenyl-3-[2-(1,3-dihydro-1,3,3-trimethyl-2H-indol-2-ylidene)-ethylidene]-1cyclohexen-1-yl]-ethenyl]-1,3,3-trimethyl-3H-indolium chloride, which is commercially available as NK-5775 from Summit Specialty Chemicals (Fort Lee, N.J.); and the following dyes which are commercially available from American Dye Source, Inc. (Baie D'Urfe, Quebec, Canada):

2-[2-[2-chloro-3-[(1,3-dihydro-3,3-dimethyl-1-propyl-2H-indol-2-ylidene) ethylidene]-1-cyclohexen-1-yl]ethenyl]-3,3-dimethyl-1-propyl-1H-indolium iodide (ADS775PI, $\lambda_{max}\approx780$ nm);

2-[2-[2-chloro-3-[(1,3-dihydro-3,3-dimethyl-1-(2-hydroxy)-ethyl-2H-indol-2-ylidene)ethylidene]-1-cyclohexen-1-yl]ethenyl]-3,3-dimethyl-1-(2-hydroxy) ethyl-1H-indolium perchlorate (ADS780HO, $\lambda_{max}\approx780$ nm);

bis(3,4-dimethoxy-2'-chlorodithiobenzil)nickel (ADS885MC, $\lambda_{max}\approx885$ nm);

N,N,N',N'-tetrakis(4-dibutylaminophenyl)-p-benzoquinone bis(iminium hexafluoroantimonate) (ADS1065A, $\lambda_{max}\approx1060$ nm). The preceding dyes are provided as examples only; any infrared-absorbing compound that exhibits an electronic transition in the near-infrared region is suitable in the practice of the present invention.

Initiator

The initiator of the initiator system is a compound having a functional group capable of producing radicals when used in the initiator system and upon exposure to infrared light of an appropriate wavelength. Functional groups capable of producing radicals include, for example, alkyl halide, aryl halide, peroxide, dithiol, borate, triarylalkylborate, alkyl amine, ine, trimethylsilylmethyl, carboxymethyl, carbonyl, nitroso, etc.

One suitable class of initiators is the azine compounds, and ionic forms (i.e., azinium). Azine compounds are organic heterocyclic compounds containing a six-membered ring formed from carbon and nitrogen atoms. Azine compounds include a heterocyclic group such as a pyridine, diazine, or triazine substituent.

Azine compounds also include polycyclic compounds having a pyridine, diazine, or triazine substituent fused to one or more aromatic rings, typically carbocyclic aromatic rings. Thus, the azine compounds include, for example, compounds having a quinoline, isoquinoline, benzodiazine, or naphthodiazine substituent. To achieve the highest attainable activation efficiency per unit of mass, it is desirable to employ initiators having monocyclic azine substituents. However, polycyclic azine compounds are also suitable initiators in the practice of the present invention.

Especially suitable as initiators include triazine compounds, which include a six-membered ring containing three carbon atoms and three nitrogen atoms. Suitable triazines are disclosed, for example, in U.S. Pat. No. 6,309,792 to Hauck, et al., U.S. Pat. No. 6,010,824 to Komano, et al., U.S. Pat. No. 5,885,746 to Iwai, et al., U.S. Pat. No. 5,496,903 to Watanabe, et al., and U.S. Pat. No. 5,219,709 to Nagasaka, et al.

Halomethyl-substituted triazines, such as trihalomethyl triazines, are particularly effective as the initiator in the initiator system. By way of example, the following trihalomethyl triazine compounds are effective initiators in the present invention:

2-(4-methoxyphenyl)4,6-bis(trichloromethyl)-2-triazine;
2-(4-methylthiophenyl)4,6-bis(trichloromethyl)-2-triazine;
2-(4-chlorophenyl)-4,6-bis(trichloromethyl)-2-triazine;
2-phenyl-4,6-bis(trichloromethyl)-2-triazine;
2,4,6-tri-(trichloromethyl)-2-triazine;
2,4,6-tri-(tribromomethyl)-2-triazine.

Azinium compounds are also suitable as initiators. In azinium compounds, a quaternizing substituent of a nitrogen atom in an azine ring is capable of being released as a free radical. In some suitable azinium compounds the quaternizing substituent is an alkoxy (i.e., —O—R) substituent. The alkoxy substituent which quaternizes a ring nitrogen atom of the azinium nucleus can be selected from among a variety of synthetically convenient alkoxy substitutents. The moiety R can, for example, be an alkyl group, which can be substituted; for example aralkyl and sulfoalkyl groups are contemplated. Several suitable alkoxy substitutents contain only 1 or 2 carbon atoms, however.

Another suitable class of initiators is the onium salts. Onium salts are salts of cationic Lewis acid centers, which generally are hypervalent and have organic substituents. Onium salts include, for example, sulfonium salts, phosphonium salts, diazonium salts, and halonium salts such as iodonium salts. Suitable onium salts are described, for example, in U.S. Pat. No. 5,086,086 to Brown-Wensley, et al., U.S. Pat. No. 5,965,319 to Kobayashi, and U.S. Pat. No. 6,051,366 to Baumann, et al The identity of the counteranion corresponding to the onium salt is not critical to the effectiveness of the initiator system of the present invention.

Phosphonium compounds include a positively-charged hypervalent phosphorus with four organic substituents. Sulfonium compounds have a positively-charged hypervalent sulfur with three organic substituents. Triphenylsulfonium salts, for example, are suitable initiators.

Diazonium compounds possess a positively-charged azo group (i.e., —N≡N$^+$). N-substituted N-heterocyclic salts such as N-alkoxypyridinium salts are suitable initiators, for example.

Iodonium compounds have a positively-charged hypervalent iodine with two organic substituents. By way of example, diaryliodonium ($Ar^1$-$I^+$-$Ar^2$; Ar=aryl group) salts such as diphenyliodonium salts are suitable initiators.

Metallocene Compound

The metallocene compound of the initiator system is an organometallic compound having at least one cyclopentadienyl ligand bonded to a transition metal center. The cyclopentadienyl ligand is optionally substituted at one or all of the ring carbons. In a metallocene compound, a cyclopentadienyl ligand is bound in a pentahapto ($\eta^5$) fashion; i.e., each carbon of the five-membered ring is coordinated to the transition metal center. Metallocenes are known for a wide variety of transition metals, including iron, titanium, tungsten, molybdenum, nickel, cobalt, chromium, zirconium, and manganese, for example.

One type of metallocene that is suitable for use in the initiator system is the ferrocene compounds. Ferrocene compounds have an iron center coordinated by at least one cyclopentadienyl ligand. Ferrocene compounds also include the bicydopentadienyl "sandwich" compounds.

Suitable ferrrocene compounds include those that have a hexahapto benzene ligand coordinated to the iron center, such as for example ($\eta^6$)benzene-($\eta^5$)cyclopentadienyl iron hexafluorophosphate and ($\eta^6$)methylethylbenzene-($\eta^5$) cyclopentadienyl iron hexafluorophosphate. Also suitable are the "sandwich" type which feature two pentahapto cyclopentadienyl-derived ligands, such as those described in U.S. Pat. No. 5,389,700 to Sasaki, including:

(bis)cyclopentadienyl iron;
ethylcyclopentadienyl-cyclopentadienyl iron;
acetylcyclopentadienyl-cyclopentadienyl iron;
(bis)acetylcyclopentadienyl iron;
phenylcyclopentadienyl-cyclopentadienyl iron;
(bis)phenylcyclopentadienyl iron;
vinylcyclopentadienyl-cyclopentadienyl iron;
formylcyclopentadienyl-cyclopentadienyl iron;
carboxylcyclopentadienyl-cyclopentadienyl iron;
cyanocyclopentadienyl-cyclopentadienyl iron;
acetylcyclopentadyenyl-cyanocyclopentadienyl iron;
nitrocyclopentadienyl-cyclopentadienyl iron;
1,2-diphenylcydopentadiene-cyclopentadiene iron;
(bis)1,3-biphenylcyclopentadienyl iron;
(bis)1,2,4-triphenylcyclopentadienyl iron;
(bis)1,2,3,4-tetraphenylcyclopentadienyl iron;
(bis)1,2,3,4,5-pentaethylcyclopentadienyl iron;
(1-ethyl-2-methylcyclopentadienyl)-methylcyclopentadienyl iron.

Other suitable ferrocenes include derivatives of any of the preceding, such as those having halogenated, aryl-substituted, or haloaryl-substituted cyclopentadienyl ligands, for example.

Another type of metallocene that is suitable in the initiator system is the titanocene compounds. Titanocene compounds have a titanium center coordinated by at least one pentahapto cyclopentadienyl ligand, and generally include additional ligands. The additional ligands may be any ligand known for organometallic complexes. Some suitable titanocene compounds include in their structures aryl ligands, haloaryl ligands, or pytrole-substituted aryl ligands, for example. One commercially available titanocene compound suitable for use in the present invention is (bis)cyclopentadienyl-(bis)2,6-difluoro-3-(pyrr-1-yl)phen-1-yl titanium, sold by Ciba-Geigy Corporation (Tarrytown, N.Y.) under the trade name IRGACURE 784.

Some other suitable titanocene compounds include:
(bis)cyclopentadienyl-(bis)chloride titanium
(bis)cyclopentadienyl-(bis)phenyl titanium
(bis)cyclopentadienyl-(bis)2,3,4,5,6-pentafluorophen-1-yl titanium
(bis)cyclopentadienyl-(bis)2,3,5,6-tetrafluorophen-1-yl titanium
(bis)cyclopentadienyl-(bis)2,4,6-trifluorophen-1-yl titanium
(bis)cyclopentadienyl-(bis)2,6-difluorophen-1-yl titanium
(bis)cyclopentadienyl-(bis)2,4-difluorophen-1-yl titanium
(bis)methylcyclopentadienyl-(bis)2,3,4,5,6-pentafluorophen-1-yl titanium
(bis)methylcyclopentadienyl-(bis)2,3,5,6-tetrafluorophen-1-yl titanium
(bis)methylcyclopentadienyl-(bis)2,4,6-trifluorophen-1-yl titanium
(bis)methylcyclopentadienyl-(bis)2,6-difluorophen-1-yl titanium
(bis)methylcyclopentadienyl-(bis)2,4-difluorophen-1-yl titanium Other suitable titanocenes are listed, for example, in U.S. Pat. Nos. 4,548,891 and 4,590,287 to Riediker, et al., U.S. Pat. Nos. 5,008,302 and 5,106,722 to Hüsler, et al. and U.S. Pat. No. 6,153,660 to Fujimaki, et al.

Infrared-Sensitive Composition

The present invention also provides an infrared-sensitive composition including an ethylenically unsaturated polymerizable component, an infrared-absorbing compound that exhibits an electronic transition band in the near-infrared region, an initiator, and a metallocene compound. Upon exposure to infrared radiation, the composition is capable of producing radicals sufficient to initiate a photopolymerization reaction. The infrared-sensitive composition may further include binders, colorants, or other additives.

Polymerizable Component

The infrared-sensitive composition requires an ethylenically unsaturated polymerizable component. The polymerizable component may be present in solid or liquid form, with solid and viscous liquid forms preferred. The polymerizable component may be a monomer, oligomer, or prepolymer.

As ethylenically unsaturated polymerizable monomers or oligomers, use can be made of, for example, acrylic or methacrylic acid, or acrylic or methacrylic acid derivatives with one or more unsaturated groups, preferably esters of acrylic or methacrylic acid in the form of monomers, oligomers or prepolymers. Also suitable is itaconic acid, crotonic acid, isocrotonic acid, maleic acid, and derivatives thereof such as esters or amides.

The compounds suitable as monomers include, for instance, trimethylol propane triacrylate or methacrylate, pentaerythrite triacrylate or methacrylate, dipentaerythrite monohydroxy pentaacrylate or methacrylate, dipentaerythrite hexaacrylate or methacrylate, pentaerythrite tetraacrylate or methacrylate, dittimethylol propane tetracrylate or methacrylate, diethyleneglycol diacrylate or methacrylate, triethyleneglycol diacrylate or methacrylate, or tetraethyleneglycol diacrylate or methacrylate.

Suitable oligomers or prepolymers include urethane acrylates or methacrylates, epoxide acrylates or methacrylates, polyester acrylates or methacrylates, polyether acrylates or methacrylates, or unsaturated polyester resins.

Besides monomers and oligomers, prepolymers having C=C bonds in the back bone and/or in the side chains can be used. Examples include the reaction products of maleic anhydride-olefin-copolymers and hydroxyalkyl(meth) acrylates, polyesters containing an allyl alcohol group, reaction products of polymeric polyalcohols and isocyanate (meth)acrylates, unsaturated polyesters and (meth)acrylate terminated polystyrenes, poly(meth)acrylics and polyethers.

Other suitable polymerizable components are listed in U.S. Pat. No. 6,335,144 to Murota, et al., U.S. Pat. No. 5,229,253 to Zertani, et al, U.S. Pat. No. 5,106,722 to Hüsler, et al, and U.S. Pat. No. 4,548,891 to Riediker, et al.

The quantity of the ethylenically unsaturated polymerizable component in the infrared-sensitive composition is preferably about 35 to about 60 wt.-% based on the total solids content of the IR-sensitive composition; especially preferred is a quantity from about 45 to about 55 wt-%.

Infrared-Absorbing Compound

The infrared-absorbing compounds described above for use in the initiator system of the present invention are also suitable for use in the infrared-sensitive composition. Particularly suitable are the cyanine dyes or indocyanine dyes. The infrared-absorbing compound is preferably present in the infrared-sensitive composition in a quantity from about 0.05 to about 20 wt.-%, based on the total solids content of the infrared-sensitive composition; especially preferred is a quantity from about 0.5 to about 8 wt.-%.

Initiator

The initiators described above for use in the initiator system of the present invention are also suitable for use in the infrared-sensitive composition. Particularly suitable are halomethyl triazine compounds or trihalomethyl triazine compounds, or the onium salts or iodonium salts. The initiator is preferably present in the infrared-sensitive composition in a quantity from about 2 to about 15 wt.-%, based on the total solids content of the infrared-sensitive composition; especially preferred is a quantity from about 4 to about 7 wt.-%.

Metallocene

The metallocene compounds described above are suitable for use in the infrared-sensitive composition. Particularly suitable are the ferrocene compounds and titanocene compounds. The metallocene compound is preferably present in the infrared-sensitive composition in a quantity from about 1 to about 10 wt.-% based on the total solids content of the infrared-sensitive composition; especially preferred is a quantity from about 1.5 to about 3 wt.-%.

Polymeric Binder

The infrared-sensitive composition may optionally comprise a polymeric binder. A wide variety of known polymers or polymeric mixtures are suitable as binders. By way of example, acrylic acid copolymers or methacrylic acid copolymers are particularly suitable. Other binders that may be suitable include homopolymers or copolymers of acrylonitrile, acrylamide, polyvinyl alcohol, phenol, formaldehyde, styrene, butadiene, vinyl acetate, vinyl chloride, or vinylidine chloride; linear polymers such as polyamides, polyesters, polycarbonates, or polyurethanes; or linear water-soluble polymers such as polyvinylpyrrolidone, polyethylene oxide or other polyethers.

The polymeric binder may be present in the infrared-sensitive composition in a quantity from about 30 to about 60 wt.-%, based on the total solids content of the infrared-sensitive composition; especially preferred is a quantity from about 35 to about 45 wt.-%.

Colorant

The infrared-sensitive composition may also optionally include contrast-enhancing colorant for improving the contrast of an image produced in the infrared-sensitive composition. The presence of a colorant aids in visualization of an image when the infrared-sensitive composition is used as a photosensitive layer of a lithographic printing plate precursor. Suitable colorants include dyes that dissolve well in a solvent or solvent mixture in which the infrared-sensitive composition is dissolved or suspended for coating, or pigments that are easily dispersed in the infrared-sensitive composition. Suitable contrast-enhancing colorants may include rhodamine dyes, triarylmethane dyes, methyl violet, ethyl violet, crystal violet, carbon black, titanium dioxide, anthraquinone dyes or pigments, azo dyes or pigments, and phthalocyanine dyes or pigments. The contrast-enhancing colorant is preferably present in the infrared-sensitive composition in a quantity from about 1 to 15 wt.-%, especially preferred is a quantity from about 2 to about 7 wt.-%. When a colorant is used, care should be taken so that the photosensitivity of the infrared-sensitive composition is not unacceptably reduced.

Other Optional Additives

The infrared-sensitive composition of the present invention may also include other additives. For example, the composition may include: a softening agent; an inhibitor for preventing thermal polymerization; a crosslinking agent; an inorganic filler; a sensitizing agent to improve the adherence of ink after polymerization of the composition; a surfactant for enhancing the cosmetic appearance of the composition after polymerization.

Suitable softening agents include, for example, dibutyl phthalate, dioctyl phthalate, didodecyl phthalate, triethylene glycol dicaprylate, dimethyl glycol phthalate, dibutyl sebacate, dioctyl adipate, and triaryl phosphates such as tricresyl phosphate. If a softening agent is used, it is preferably present in a quantity from about 0.25 to 10 wt.-%.

The infrared-sensitive composition may also include an inhibitor for preventing thermal polymerization of the polymerizable component. Suitable inhibitors may include, for example, hydroquinone, benzoquinone, p-methoxyphenol, and di-t-butyl-p-cresol. If an inhibitor is used, it is preferably present in a quanity from about 0.01 wt.-% to 2 wt.-%.

By way of example only, an infrared-sensitive composition may be prepared according to Table 2. The infrared-sensitive composition may be prepared with or without solvent; Table 2 lists the weight-percents for each component based only on the total solids content, and also based on the solvent-borne composition.

The ingredients for an infrared-sensitive composition according to the present invention may be combined or mixed by conventional techniques. The resulting infrared-sensitive composition is generally not sensitive to exposure to air; however, the infrared-sensitive composition is light-sensitive and should be handled in darkness or in safe lighting conditions, such as under yellow light.

The infrared-sensitive compositions of the present invention are useful for the manufacture of printing plate precursors, for example. In addition, however, they may be used in recording materials for creating images on suitable substrates and receiving sheets, for creating reliefs that may serve as printing plates, screens and the like, as radiation-curable varnishes for surface protection and for the formulation of radiation-curable printing inks.

The infrared-sensitive composition of the present invention is advantageous in that a printing plate precursor may be produced that has enhanced imaging speed, relative to an initiator system including only an infrared-absorbing compound and an initiator. As demonstrated by the following Example 1 and Comparative Example 3, an exposure energy of only 198 mJ/cm$^2$ was required to achieve maximum processing density when a metallocene compound is included, versus 300 mJ/cm$^2$ when no metallocene compound is included.

Method of Making a Printing Plate Precursor

Also provided by the present invention is a method of making a printing plate precursor, including the steps of: a) preparing a substrate to receive a coating; b) applying to a portion of the substrate a solvent-based composition including an ethylenically unsaturated polymerizable component, an infrared-absorbing compound that exhibits an electronic transition band in the near-infrared region, an initiator, a metallocene compound, and a polymeric binder; and c) removing the solvent to leave a coating on the substrate, to yield the precursor. Upon exposure to infrared radiation, the coating on the substrate is capable of producing radicals sufficient to initiate a photopolymerization reaction.

Preparation of Substrate

For the manufacture of printing plate precursors, conventional substrates may be used. For example, the use of an aluminum plate as the substrate is suitable.

The substrate is first prepared to receive a coating. When an aluminum substrate is used, it is desirable to pretreat the surface to be coated by a mechanical or chemical process. The pretreatment may include roughening the surface by brushing in a dry state, brushing with an abrasive suspension, or electrochemically, e.g. in an hydrochloric acid electrolyte, to roughen the surface in order to improve the adhesiveness of the coating to the surface or to improve the water wettability of the surface. The pretreatment may also include anodic oxidation of the roughened plate in sulfuric or phosphoric acid. The oxidized plate may then subjected to a hydrophilizing treatment, such as in an aqueous solution of polyvinylphosphonic acid or phosphonic acid.

The above-described substrate pretreatment is conventional in the art. A detailed description of a suitable pretreatment may be found in European Patent Application EP 1 106 381. Other substrate pretreatments may also be suitable.

Additionally, other substrate materials may be suitable, such as: steel, zinc, or copper foil; plastic sheets such as those made from polyethyleneterephthalate or cellulose acetate; or screen printing substrates such as Perlon gauze. Substrate pretreatments may be necessary, as determined by the choice of substrate and the particular application; conventional pretreatments will be suitable. In some instances, the preparation of the substrate to receive a coating will be minimal, and in other cases it may be extensive.

Application of an Infrared-Sensitive Composition to the Substrate

After the substrate is prepared to receive a coating, a solvent-based infrared-sensitive composition is applied to a portion of the substrate. The infrared-sensitive composition includes an ethylenically unsaturated polymerizable component, an infrared-absorbing compound that exhibits an electronic transition band in the near-infrared region, an initiator, a metallocene compound, and a polymeric binder. The ethylenically unsaturated polymerizable components, infrared-absorbing compounds, initiators, metallocene compounds, and polymeric binders described above in conjunction with the initiator system and the infrared-sensitive compositions of the present invention are suitable for use in the infrared-sensitive composition of the method.

The infrared-sensitive composition is carried by an appropriate solvent, such as an organic solvent or solvent mixture. Conventional organic solvents are suitable when a hydrophobic polymerizable component and/or binder is employed. Suitable organic solvents include, for example: ketones such as methyl ethyl ketone; aromatic solvents such as toluene; alcohols; ethers; aliphatic solvents.

The solvent-based infrared composition may be applied to the substrate by any suitable method. For example, the solvent-based composition may be applied by way of a bar coater, a foiler, a wire-wound rod, casting methods, or other conventional methods.

The infrared-sensitive composition is generally not sensitive to exposure to air; however, the infrared-sensitive composition is light-sensitive. Therefore, the application of the coating and subsequent steps of the method should be undertaken in darkness or in safe lighting conditions, such as under yellow light.

Removal of Solvent

After application of the solvent-based infrared-sensitive composition to the substrate, the solvent is removed to leave an infrared-sensitive coating on the substrate to yield the precursor. Removal of the solvent can be accomplished by any ordinary means, such as by heating, application of vacuum, blow-drying, etc. By way of example, solvent may be removed by sending the wetted substrate through a conveyor oven for a brief period to heat the solvent to near or above its boiling temperature.

The infrared-sensitive coating is applied to the substrate to yield a dry layer weight of the coating of preferably from 0.5 to 4 g/m$^2$, and more preferably from 0.8 to 3 g/m$^2$. Upon exposure to infrared radiation, the coating on the substrate is capable of producing radicals sufficient to initiate a photopolymerization reaction.

Overcoating

Over the infrared-sensitive coating, an oxygen-impermeable overcoating layer may optionally be applied as is conventional in the art; e.g. a layer of polyvinyl alcohol, polyvinyl alcohol/polyvinyl acetate copolymers, polyvinyl pyrrolidone, polyvinyl pyrrolidone/polyvinyl acetate copolymers, polyvinyl methylether, polyacrylic acid or gelatine. The dry layer weight of the oxygen-impermeable overcoating is preferably 0.1 to 4 g/m$^2$, more preferably 0.3 to 2 g/m$^2$. An overcoating layer is useful not only as oxygen barrier, but also protects the plate against ablation during exposure to infrared radiation.

Printing Plate Precursor

The present invention further provides a printing plate precursor having an infrared-sensitive coating including an ethylenically unsaturated polymerizable component, an infrared-absorbing compound that exhibits an electronic transition band in the near-infrared region, an initiator, a metallocene compound, and a polymeric binder. Upon exposure to infrared radiation, the coating is capable of producing radicals sufficient to initiate a photopolymerization reaction.

The printing plate precursor may include a substrate, such as an aluminum plate, for example. Other substrates are listed above. The substrate may require pretreatment prior to coating, as is described above.

Infrared-Sensitive Coating

The ethylenically unsaturated polymerizable components, infrared-absorbing compounds, initiators, metallocene compounds, and polymeric binders described above in conjunction with the initiator system and the infrared-sensitive compositions of the present invention are suitable for use in the infrared-sensitive coating of the printing plate precursor.

An infrared-sensitive coating may be applied to a substrate by the method described above. Optionally, an oxygen-impermeable overcoating may be applied over the infrared-sensitive coating. The infrared-sensitive composition is generally not sensitive to exposure to air; however, the infrared-sensitive composition is light-sensitive. Therefore, the printing plate precursor should be handled and stored in darkness or in safe lighting conditions, such as under yellow light.

The printing plate precursor of the present invention exhibits enhanced shelf life compared to similar printing plate precursors, as demonstrated by an accelerated aging test. An enhanced shelf life is desirable in order to minimize the amount of material that is wasted due to aging, to maximize the processability of a printing plate precursor that has aged, and to maximize the quality of the printing plates that are obtained when the printing plate precursor has aged.

By the phrase "enhanced shelf life," it is meant that the printing plate precursor performs better in an accelerated aging test than a printing plate precursor that include a dicarboxylic acid component as a coinitiator, and which lack the titanocene compound that is present in the printing plate precursor of the invention. A printing plate precursor having an infrared-sensitive coating including a dicarboxylic acid component is described in U.S. Pat. No. 6,309,792 to Hauck, et al.

Performance in an aging test was measured before and after accelerated aging by determining the infrared energy density that is required to initiate a photopolymerization reaction, to achieve maximum processed density. The minimum energy density to achieve maximum processed density is denoted $E_{max}$. A low percentage increase in $E_{max}$ after aging relative to $E_{max}$ before aging is desirable. An accelerated aging test exposes a printing plate precursor to elevated temperature and humidity level for a fixed period of time. A printing plate precursor performs better in the accelerated aging test when its percentage increase in $E_{max}$ is lower than that of another printing plate precursor. Details of the accelerated aging test are given below, in Example 6. Results are summarized in Table 1.

TABLE 1

Summary of accelerated aging results.

| Printing Plate Precursor of: | Compound in infrared-sensitive layer | Percentage change in $E_{max}$ |
| --- | --- | --- |
| Example 1 | titanocene | −0.5% |
| Example 4 | ferrocene | −20% |
| Example 5 | dicarboxylic acid | 123% |

The accelerated aging results in Table 1 demonstrate that the metallocene-containing precursors performed better than the dicarboxylic acid-containing precursor. The dicarboxylic acid-containing precursor showed significant deterioration in the aging test, while the integrity of the metallocene-containing precursors was maintained or even enhanced during aging. The results indicate that the metallocene-containing printing plate precursors are more resistant to the effects of high temperatures and humidity than the comparable dicarboxylic acid-containing precursors.

This invention also allows the manufacture of on-press developable or water-developable lithographic printing plates imageable by infrared laser plate setters, or infrared computer-to-plate plate setters. This invention further provides laser addressable, digitally imaged printing plate precursors, which are developable on press, thereby avoiding a separate development step.

Method for Making a Printable Lithographic Printing Plate

Another embodiment of the present invention provides a method for making a printable lithographic printing plate, including the steps of: a) coating a substrate with an infrared-sensitive composition to provide a printing plate precursor; b) imagewise exposing the printing plate precursor to infrared radiation to initiate a polymerization reaction; and c) developing the exposed printing plate precursor with a developer to obtain a printable lithographic printing plate. The infrared-sensitive composition of the coating includes an ethylenically unsaturated polymerizable component, an infrared-absorbing compound that exhibits an electronic transition band in the near-infrared region, an initiator, a metallocene compound, and a polymeric binder. Upon exposure to infrared radiation, the infrared-sensitive composition is capable of producing radicals sufficient to initiate a photopolymerization reaction. The invention also provides a printing plate obtained by the method.

Coating of Substrate

In the practice of the method, a substrate is first coated with an infrared-sensitive composition to provide a printing plate precursor. The substrates and infrared-sensitive compositions described above are suitable for use in the method. The substrate may require pretreatment prior to coating, as is described above.

Coating of the substrate may be performed by the method described above, for example. If a solvent-based infrared-sensitive composition is employed, excess solvent should be removed to leave an infrared-sensitive coating in order to yield a printing plate precursor. Optionally, an oxygen-impermeable overcoating may be applied to the printing plate precursor prior to exposure.

Imagewise Exposure

The printing plate precursor is then imagewise exposed to infrared radiation to initiate a polymerization reaction. In particular, the infrared radiation should include a wavelength that falls within a near-infrared absorbance band of the infrared-absorbing compound in order to initiate the photopolymerization. Optimally, the source of radiation will emit infrared radiation at a wavelength that is as near to the peak of the absorbance band as possible. In other words, it is desirable to match the infrared radiation source to the absorbance band of the infrared-absorbing compound, if feasible.

The printing plate precursor may, for example, be imagewise exposed using semiconductor lasers or laser diodes which emit in the near-infrared region of the electromagnetic spectrum. Such a laser beam can be digitally controlled via a computer; i.e. the laser can be turned on or off so that an imagewise exposure of the precursor can be effected via stored digitalized information in the computer. Therefore, the infrared-sensitive compositions of the present invention are suitable for creating computer-to-plate (ctp) printing plates.

Presently, high-performance lasers or laser diodes used in commercially available image setters emit infrared radiation in the wavelength ranges of between 800 and 850 nm or between 1060 and 1120 nm. Other infrared-emitting light sources may also be suitable. Non-lasing sources are also suitable for the practice of the present invention, provided that the necessary power is supplied to the infrared-sensitive coating by radiation of the appropriate wavelength.

After the printing plate precursor has been imagewise exposed, it may be briefly heated to a temperature of 85° to 135° C. in order to effect complete curing of the exposed areas. Depending on the temperature, the heating step takes about 20 to 100 seconds.

Developing the Exposed Printing Plate Precursor

The exposed printing plate precursor is then developed with a developer to obtain a printable lithographic printing plate. The exposed plates are developed using conventional methods. The developed plates are usually treated with a preservative, a process known as "gumming." The preservatives are aqueous solutions of hydrophilic polymers, wetting agents and other additives.

In some embodiments, the exposed printing plate precursors are developable in aqueous developers, including on-press developability with fountain solution and printing ink. The exposed printing plate precursor may be directly mounted on press, wherein the non-exposed areas are removed by fountain solution and/or ink, thereby avoiding a separate development step. It is noted that plates designed for on-press development can alternatively be developed by a conventional process using a suitable aqueous developer.

The plates provided by this invention include on-press developable plates as well as plates which are intended for other development processes.

EXAMPLES

Example 1

This example demonstrates the effectiveness of an initiator system including an infrared-absorbing compound, an initiator, and a titanocene compound, for initiating a polymerization reaction with infrared radiation.

A coating solution was prepared having the composition set forth in Table 2:

TABLE 2

Infrared-sensitive composition.

| Component | Function | Parts by weight (solids only) | Parts by weight (including solvent) |
|---|---|---|---|
| Urethane acrylate[1] | polymerizable component | 42.5 | 3.55 |
| JAGOTEX MA 2814/MP[2] | polymeric binder | 19.4 | 1.62 |
| JONCRYL 683[3] | polymeric binder | 19.4 | 1.62 |
| SARTOMER 355[4] | polymerizable component | 8.9 | 0.74 |
| 2-(4-methoxyphenyl)-4,6-bis(trichloromethyl)-2-triazine | initiator | 4.8 | 0.40 |
| (bis)cyclopentadienyl-(bis)2,6-difluoro-3-(pyrr-1-yl)phen-1-yl titanium | metallocene compound | 2.6 | 0.22 |
| 2-[2-[2-thiophenyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium chloride | infrared-absorbing compound | 1.0 | 0.08 |
| Crystal Violet | colorant | 1.2 | 0.10 |
| BYK 307[5] | surfactant | 0.2 | 0.02 |
| Methyl ethyl ketone | solvent | — | 13.75 |
| Toluene | solvent | — | 22.91 |
| 1-methoxy-2-propanol | solvent | — | 54.99 |

[1]Urethane acrylate prepared by reacting DESMODUR N100, an aliphatic polyisocyanate resin based on hexamethylene diisocyanate from Bayer Corp. (Milford, Connecticut), with hydroxyethyl acrylate and pentaerythritol triacrylate.
[2]Jagotex terpolymer contains 43.3% styrene, 45% methyl methacrylate, and 11.7% acrylic add.
[3]Acrylic polymer from SC Johnson Polymers (Sturtevant, Wisconsin).
[4]Multi-functional acrylic monomer (ditrimethylolpropane tetraacrylate) from Sartomer Co. (Exton, Pennsylvania).
[5]Polyether-modified poly-dimethyl-siloxane from Byk-Chemie (Wallingford, Connecticut).

The following procedure was used to produce a printing plate:

a) An aluminum substrate was electrochemically grained, anodized, and treated with polyvinylphosphonic acid.

b) The substrate was then coated with the coating solution using a wire-wound rod, and then dried for approximately 60 seconds residence time in a Ranar conveyer oven at about 94° C. to drive off residual solvent and leave a coating layer. The coating layer had a dry coating weight of about 2 g/m².

c) An overcoat solution was prepared from 5.26 parts AIRVOL 203, (a polyvinyl alcohol commercially available from Air Products and Chemicals, Inc. of Allentown, Pa.), 0.93 parts polyvinylimidazole, 3.94 parts isopropanol, and 89.87 parts water. The overcoat solution was applied to the substrate over the coating layer using a wire-wound rod, and the substrate was dried for approximately 60 seconds residence time in a Ranar conveyer oven at about 94° C. to leave an overcoating layer and yield a printing plate precursor. The overcoating layer had a dry coating weight of about 2 g/m².

d) The printing plate precursor was imaged on a CREO TRENDSETTER 3244x at 4 watts and 35 to 250 rpm, emitting radiation at a wavelength of about 830 nm.

e) The exposed plate was then developed by passing it through a PHW-32 processor charged with Kodak Polychrome Grapics Developer 980 (Kodak Polychrome Graphics LLC, Norwalk, Conn.), with the preheat section set to 500° C.

An exposure series was done at energy densities ranging from 36 to 258 mJ/cm². The minimum exposure energy necessary to achieve maximum processed density was about 198 mJ/cm².

A developed plate was mounted on an ABDick duplicator, and produced more than 1,000 excellent reproductions.

Comparative Example 2

This example demonstrates the ineffectiveness of an infrared-absorbing compound, a titanocene, and a dicarboxylic acid for initiating a photopolymerization reaction.

A coating solution was prepared as in Example 1, except for the following changes:
2-(4-methoxyphenyl)-4,6-bis(trichloromethyl)-2-triazine was omitted.
(bis)cyclopentadienyl-(bis)2,6-difluoro-3-(pyrr-1-yl)phen-1-yl titanium increased to 0.40 parts by weight.
N-phenyliminodiacetic acid was included at 0.22 parts by weight.

Steps a) through c) as detailed in Example 1 were then carried out using the coating solution. Step d) was carried out, except that imaging was done at 5 watts. Step e) was carried out as described in Example 1.

An exposure series was done at energy densities ranging from 45 to 322 mJ/cm². Following processing, no coating remained on the substrate. No photopolymerization occurred at these exposures. The titanocene compound is ineffective at these exposures unless an initiator, such as 2-(4-methoxyphenyl)-4,6-bis(trichloromethyl)-2-triazine, is present.

Comparative Example 3

This example demonstrates the relative photospeed and efficiency provided by an initiator system including a titanocene compound with an infrared-absorbing compound and an initiator, as compared with an initiator system including only the infrared-absorbing compound and initiator.

A coating solution was prepared as in Example 1, except for the following change: (bis)cyclopentadienyl-(bis)2,6-difluoro-3-(pyrr-1-yl)phen-1-yl titanium was omitted, with all other relative quantities increasing proportionally.

Steps a) through c) as detailed in Example 1 were then carried out using the coating solution. Step d) was carried out, except that imaging was done on a CREO TRENDSETTER 3230 at 10 watts.

The exposed plate was then developed by passing it through a TECHNIGRAPH processor charged with POLYCHROME 953 developer (equivalent to Kodak Polychrome Grapics Developer 980), the processor equipped with a pre-development heating unit adjusted to bring the plate surface temperature to 125° C.

An exposure series was done at energy densities ranging from 100 to 800 mJ/cm². The minimum exposure energy required to achieve maximum processed density was about 300 mJ/cm².

Example 4

This example demonstrates the effectiveness of an initiator system including an infrared-absorbing compound, an initiator, and a ferrocene compound.

A coating solution was prepared as in Example 1, except for the following change: (bis)cyclopentadienyl-(bis)2,6-difluoro-3-(pyrr-1-yl)phen-1-yl titanium was substituted with ($\eta^6$)methylethylbenzene-($\eta^5$)cyclopentadienyl iron hexafluorophosphate.

Steps a) through c) as detailed in Example 1 were then carried out using the coating solution. Step d) was carried out, except that imaging was done at 7 watts. Step e) was carried out as described in Example 1.

An exposure series was done at energy densities ranging from 65 to 451 mJ/cm$^2$. The minimum exposure energy necessary to achieve maximum processed density was about 125 mJ/cm$^2$.

Comparative Example 5

A coating solution was prepared as in Example 1, except for the following change: (bis)cyclopentadienyl-(bis)2,6-difluoro-3-(pyrr-1-yl)phen-1-yl titanium was substituted with N-phenyliminodiacetic acid, at the same weight-percent.

Steps a) through c) as detailed in Example 1 were then carried out using the coating solution. Step d) was carried out, except that imaging was done at 7 watts. Step e) was carried out as described in Example 1.

An exposure series was done at energy densities ranging from 65 to 451 mJ/cm$^2$. The minimum exposure energy necessary to achieve maximum processed density was about 75 MJ/cm$^2$.

Example 6

This example demonstrates the enhanced shelf life of a printing plate precursor having an infrared-sensitive coating including an infrared-absorbing compound, an initiator, and a metallocene compound.

The minimum exposure energy necessary to achieve maximum processed density was measured for fresh sample printing plate precursors from Example 1, Example 4, and Comparative Example 5 as described above.

Accelerated aging of sample printing plate precursors from Example 1, Example 4, and Comparative Example 5 was performed by hanging uncovered printing plate precursors in a humidity chamber set at 80% relative humidity and 38° C. for five days.

Each sample was imaged as in step d) of Example 1, except that the imaging was done at 7 watts. Each sample was then developed as in step e) of Example 1.

An exposure series was done at energy densities ranging from 65 to 451 mJ/cm$^2$ for the aged sample printing plate precursors of each Example. The minimum exposure energy necessary to achieve maximum processed density was measured for each group of sample printing plate precursors. The results are listed in Table 3.

TABLE 3

Accelerated aging data.

| Printing Plate Precursor of: | Type of Compound in infrared-sensitive layer | $E_{max}$ for Fresh Plate (mJ/cm$^2$) | $E_{max}$ for Aged Plate (mJ/cm$^2$) | Percentage change in $E_{max}$ |
|---|---|---|---|---|
| Example 1 | titanocene | 198 | 197 | −0.5% |
| Example 4 | ferrocene | 125 | 100 | −20% |
| Example 5 | dicarboxylic acid | 75 | 167 | 123% |

This invention, as set out in the appended claims, is not to be taken as limited to all of the details set out in this specification, as modifications and variations thereof may be made without departing from the spirit or scope of the invention.

What is claimed is:

1. An initiator system for initiating a photopolymerization reaction, the initiator system comprising:
    a) at least one infrared-absorbing compound that exhibits an electronic transition band in the near-infrared region;
    b) at least one initiator, wherein the initiator is an azine, azinium, or onium compound; and
    c) at least one titanocene compound;
wherein the initiator system is capable of producing radicals sufficient to initiate the photopolymerization reaction upon exposure to infrared radiation.

2. The initiator system of claim 1 wherein the infrared-absorbing compound exhibits an electronic transition band in the range 700–3000 nm.

3. The initiator system of claim 1 wherein the infrared-absorbing compound exhibits an electronic transition band in the range 700–1300 nm.

4. The initiator system of claim 1 wherein the infrared-absorbing compound is a cyanine dye.

5. The initiator system of claim 1 wherein the infrared-absorbing compound is an indocyanine dye.

6. The initiator system of claim 1 wherein the initiator is a halomethyl triazine compound.

7. The initiator system of claim 1 wherein the initiator is a trihalomethyl triazine compound.

8. The initiator system of claim 1 wherein the initiator is an onium compound.

9. The initiator system of claim 1 wherein the initiator is an iodonium compound.

10. An infrared-sensitive composition comprising:
    a) an ethylenically unsaturated polymerizable component;
    b) at least one infrared-absorbing compound that exhibits an electronic transition band in the near-infrared region;
    c) at least one initiator, wherein the initiator is an azine, azinium, or onium compound; and
    d) at least one titanocene compound;
wherein the composition is capable of producing radicals sufficient to initiate a polymerization reaction upon exposure to infrared radiation.

11. The composition of claim 10 wherein the infrared-absorbing compound exhibits an electronic transition band in the range 700–3000 nm.

12. The composition of claim 10 wherein the infrared-absorbing compound exhibits an electronic transition band in the range 700–1300 nm.

13. The composition of claim 10 wherein the infrared-absorbing compound is a cyanine dye.

14. The composition of claim 10 wherein the infrared-absorbing compound is an indocyanine dye.

15. The composition of claim 10 wherein the initiator is a halomethyl triazine compound.

16. The composition of claim 10 wherein the initiator is a trihalomethyl triazine compound.

17. The composition of claim 10 wherein the initiator is an onium compound.

18. The composition of claim 10 wherein the initiator is an iodonium compound.

19. The composition of claim 10 wherein the ethylenically unsaturated polymerizable component is a monomeric, oligomeric, or polymeric compound containing at least one polymerizable ethylenically unsaturated C=C bond.

20. The composition of claim 19 wherein the ethylenically unsaturated compound is an acrylic acid derivative or a methacrylic acid derivative.

21. The composition of claim 19 wherein the ethylenically unsaturated compound is an acrylic acid ester or a methacrylic acid ester.

22. The composition of claim 10 further comprising a polymeric binder.

23. The composition of claim 22 wherein the binder comprises an acrylic acid copolymer or a methacrylic acid copolymer.

24. The composition of claim 10 further comprising at least one contrast-enhancing colorant.

25. The composition of claim 10 having:
   i) about 35 to about 60 wt.-% of the ethylenically unsaturated polymerizable component;
   ii) about 0.5 to about 8 wt.-% of the infrared absorbing compound;
   iii) about 2 to about 15 wt.-% of the initiator compound; and
   iv) about 1 to about 10 wt.- % of the titanocene compound;
based on the total solids content of the infrared-sensitive composition.

26. The composition of claim 25 having about 30 to about 60 wt.-% of a polymeric binder, based on the total solids content of the infrared-sensitive composition.

27. The composition of claim 25 having about 1 to about 15 wt.-% of a contrast-enhancing colorant, based on the total solids content of the infrared-sensitive composition.

28. A method of making a printing plate precursor comprising the steps of:
   a) preparing a substrate to receive a coating;
   b) applying to a portion of the substrate a composition comprising a solvent and
      i) an ethylenically unsaturated polymerizable component;
      ii) at least one infrared-absorbing compound that exhibits an electronic transition band in the near-infrared region;
      iii) at least one initiator, wherein the initiator is an azine, azinium, or onium compound;
      iv) at least one titanocene compound; and
      v) a polymeric binder; and
   c) removing the solvent to leave a coating on a portion of the substrate, wherein the coating is capable of producing radicals sufficient to initiate a polymerization reaction upon exposure to infrared radiation;
to yield the printing plate precursor.

29. The method of claim 28 further comprising the step of applying an oxygen-impermeable overcoating on at least a portion of the coating.

30. A printing plate precursor with an infrared-sensitive coating comprising:
   a) an ethylenically unsaturated polymerizable component;
   b) at least one infrared-absorbing compound that exhibits an electronic transition band in the near-infrared region;
   c) at least one initiator, wherein the initiator is an azine, azinium, or onium compound;
   d) at least one titanocene compound; and
   e) a polymeric binder;
wherein the coating is capable of producing radicals sufficient to initiate a polymerization reaction upon exposure to infrared radiation.

31. The printing plate precursor of claim 30 further comprising an oxygen-impermeable overcoating on at least a portion of the coating.

32. The printing plate precursor of claim 30 wherein the printing plate precursor exhibits enhanced shelf life.

33. A method of making a printable lithographic printing plate comprising the steps of:
   a) coating a substrate with an infrared-sensitive composition to provide a printing plate precursor, the infrared-sensitive composition comprising
      i) an ethylenically unsaturated polymerizable component;
      ii) at least one infrared-absorbing compound that exhibits an electronic transition band in the near-infrared region;
      iii) at least one initiator, wherein the initiator is an azine, azinium, or onium compound;
      iv) at least one titanocene compound; and
      v) a polymeric binder;
      wherein the composition is capable of producing radicals sufficient to initiate a polymerization reaction upon exposure to infrared radiation;
   b) imagewise exposing the printing plate precursor to infrared radiation to initiate the polymerization reaction; and
   c) developing the exposed printing plate precursor with a developer to obtain a printable lithographic printing plate.

34. The method of claim 33 wherein step c) is conducted on-press and the developer is a fountain solution, an ink, or a combination thereof.

35. The method of claim 33 further comprising the step of applying an oxygen-impermeable overcoating to the printing plate precursor.

36. The method of claim 33 further comprising the step of heating the printing plate precursor.

37. A printing plate obtained by the method of claim 33.

* * * * *